US007257005B2

(12) United States Patent
Kato

(10) Patent No.: US 7,257,005 B2
(45) Date of Patent: Aug. 14, 2007

(54) PORTABLE DEVICE

(75) Inventor: Kazuki Kato, Yokohama (JP)

(73) Assignee: Kyocera Corporation, Kyoto (JP)

( * ) Notice: Subject to any disclaimer, the term of this patent is extended or adjusted under 35 U.S.C. 154(b) by 311 days.

(21) Appl. No.: 10/958,988

(22) Filed: Oct. 5, 2004

(65) Prior Publication Data

US 2005/0118840 A1 Jun. 2, 2005

(30) Foreign Application Priority Data

Oct. 7, 2003 (JP) ............................ 2003-348163

(51) Int. Cl.
*H05K 7/00* (2006.01)

(52) U.S. Cl. ...................................... 361/729; 361/755

(58) Field of Classification Search ................ 361/683, 361/686, 728, 729, 752, 755, 800–802
See application file for complete search history.

(56) References Cited

U.S. PATENT DOCUMENTS 5,832,080 A * 11/1998 Beutler et al. ......... 379/433.13
6,421,531 B1 * 7/2002 Dehan et al. ............. 455/90.1
2001/0009499 A1 * 7/2001 Carlson
2002/0076960 A1 6/2002 Ibaraki et al. ............. 439/165
2002/0135993 A1 * 9/2002 Ueyama et al.

FOREIGN PATENT DOCUMENTS

JP 2000-138522 5/2000
KR 2002-0050182 6/2002

* cited by examiner

*Primary Examiner*—Tuan Dinh
*Assistant Examiner*—Yuriy Semenenko
(74) *Attorney, Agent, or Firm*—Hogan & Hartson LLP

(57) ABSTRACT

A portable device includes a first casing which houses a circuit board having a first conductive layer, a second casing which houses a circuit board having a second conductive layer, and a coupling part which openably and closably couples the first casing and the second casing. The coupling part is made of a metal material, and the first conductive layer is electrically connected to the second conductive layer via the coupling part.

9 Claims, 5 Drawing Sheets

PORTABLE DEVICE

BACKGROUND OF THE INVENTION

1. Field of the Invention

The present invention relates to a portable device such as a mobile wireless phone and a PDA (Personal Digital Assistant), and in particular, relates to a portable device having two casings which are rotatable with respect to each other.

Priority is claimed on Japanese Patent Application No. 2003-348163, filed Oct. 7, 2003, the content of which is incorporated herein by reference.

2. Description of Related Art

In recent years, progress has been made in portable devices (portable electronic devices) such as mobile phones in that the displays have been enlarged and the number of colors has been increased in response to the large varieties of information to be displayed. Foldable type mobile phones which are excellent in both operability and portability have become the standard.

It is normal for a foldable type mobile phone to have two casings. However, these casings are constructed so as to move with respect to each other via a coupling part. Therefore, in order to make the ground potentials of the circuits provided in each of the casings equal, by connecting together the circuit boards within each conductor via a flexible cable which includes a ground wire, the ground potentials of both circuits are made equal.

One such technique is conventionally known from Japanese Unexamined Patent Application, First Publication No. 2000-138522.

In recent years, mobile phones have been made smaller, and the number of mobile phones having complicated forms has been increasing. In addition, the number of mobile phones having various built-in functions such as a camera function or a navigation function has been increasing. Therefore, although the number of wires connecting the circuit boards provided within each casing increases, it is difficult to increase the size of the coupling part, and therefore, it is difficult to pass each of the wires into the coupling part. If the wires are passed into the coupling part without a gap, then when the two casings move with respect to each other, a burden is placed on the wires such as twisting or torsion. If this is severe, there is a risk that the wires will break.

SUMMARY OF THE INVENTION

The present invention has the object of providing a portable device which has a structure that redirects static electricity generated in each of the casings to a circuit board of one of the casings, and which can respond to the requirements of being thin and lightweight by being able to simplify the structure and reduce the number of parts.

In order to achieve the above-mentioned object, the first aspect of the present invention is a portable device having a first casing which houses a circuit board having a first conductive layer, a second casing which houses a circuit board having a second conductive layer, and a coupling part which openably and closably couples the first casing and the second casing, wherein the coupling part is made of a metal material, and the first conductive layer is electrically connected to the second conductive layer via the coupling part.

In addition, the second aspect of the present invention is a portable device having a first casing which houses a circuit board having a first conductive layer, a second casing which houses a circuit board having a second conductive layer, and a coupling part which couples the first casing and the second casing so as to be rotatable with respect to each other around an axis in a direction in which the first casing and the second casing are stacked, wherein the coupling part is made of a metal material, and the first conductive layer is electrically connected to the second conductive layer via the coupling part.

The portable devices of the present invention are further characterized in that the conductive layer is ground conductor.

In addition, the portable device of the present invention further includes a conductive part which is present on at least one surface of the first or second casing, and an electrically conductive member which is elastically sandwiched between the conductive part and the coupling part. The conductive part is electrically connected with the coupling part via the electrically conductive member.

According to the portable device of the invention, since the casings electrically conduct with each other due to the coupling part which couples the casings, static electricity generated in each of the casings can be handled by allowing it to flow to one of the casings via the coupling part. By this means, it becomes unnecessary to have a structure in each casing which handles static electricity generated in each casing, it is possible to simplify the structure and reduce the number of parts, and it is possible to respond to the requirements of being thin and lightweight.

In addition, the portable device further may include a display part, a speaker, operating keys, and a microphone, wherein the display part and the speaker are disposed at a surface of the first casing opposite to the surface of the first casing facing the second casing, and the operating keys and the microphone are disposed at a surface of the second casing facing the first casing, when the first casing and the second casing are stacked.

In addition, the first casing may have a holder made of a conductive material for holding the display part, the holder is electrically connected to the coupling part.

In addition, a portable device further may include a conductive part which is present on at least one surface of the first casing, and an electrically conductive member which is elastically sandwiched between the conductive part and the coupling part, wherein the conductive part is electrically connected with the coupling part via the electrically conductive member.

In addition, the holder, the coupling part, and the circuit board having the first conductive layer may be electrically connected via a bracket.

DETAILED DESCRIPTION OF THE INVENTION

Below, a mobile phone as one example of a portable device (portable electronic device) according to a preferred embodiment of the invention will be explained with reference to the drawings.

Figure 1:
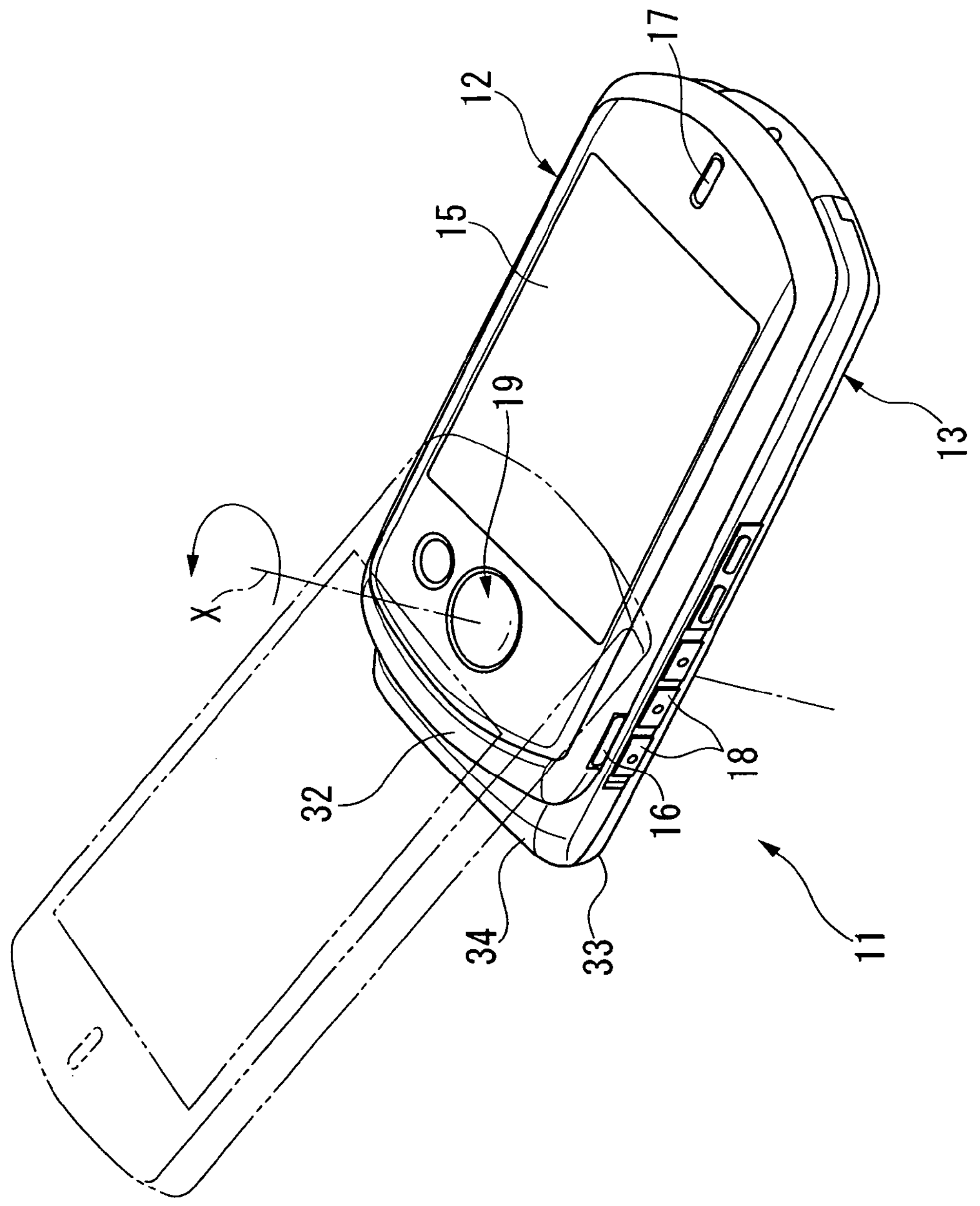
FIG. 1 is a perspective view showing the portable device according to a preferred embodiment of the present invention.
Figure 2:
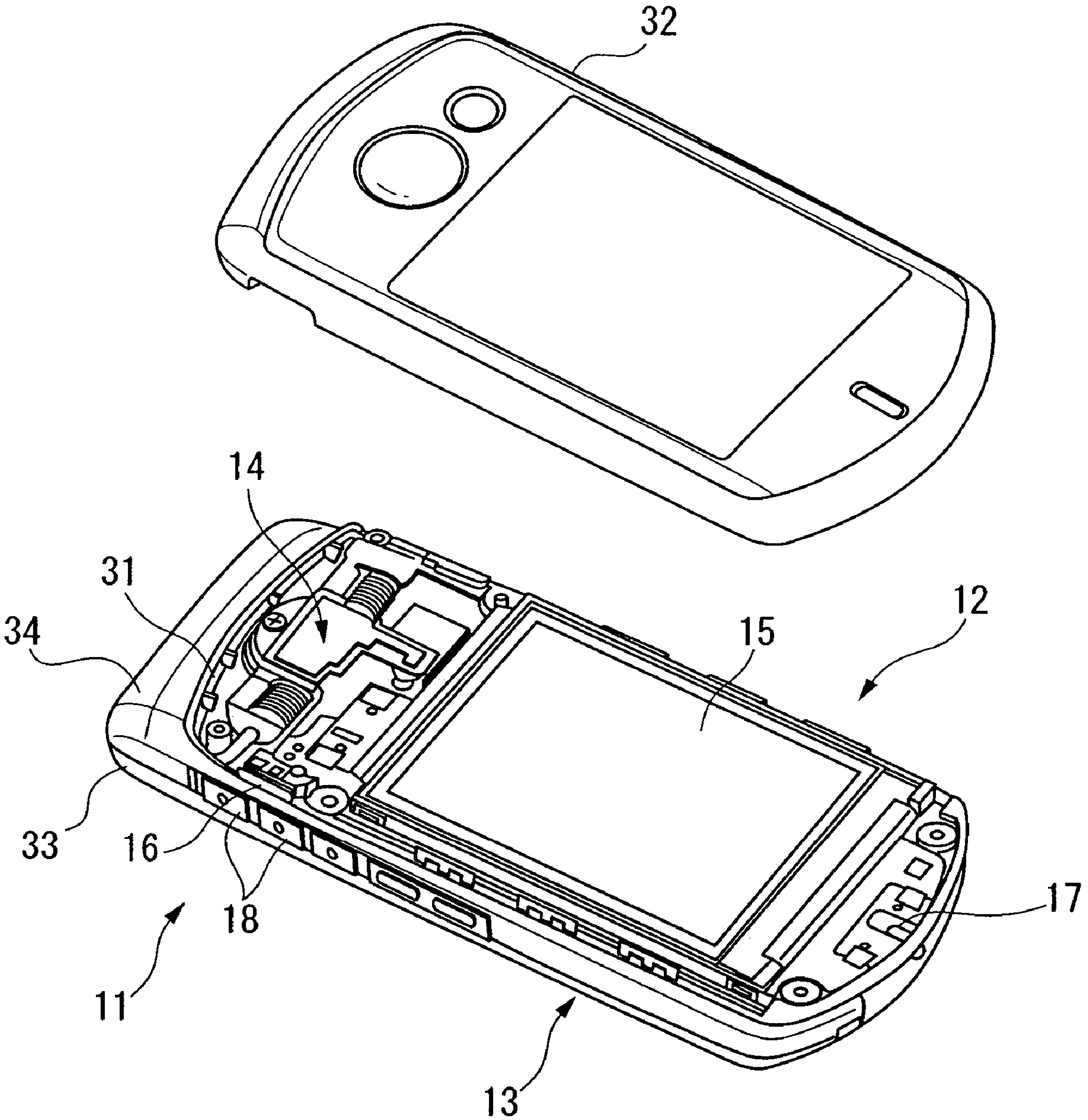
FIG. 2 is an exploded perspective view showing the state in which the display side front case of the portable device is removed.
Figure 3:
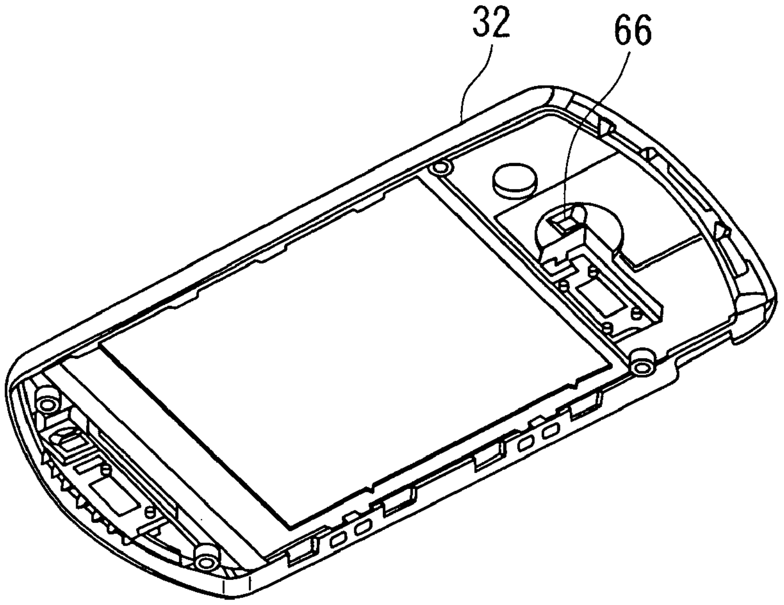
FIG. 3 is a perspective view of the display side front case seen from the rear face.
Figure 4:
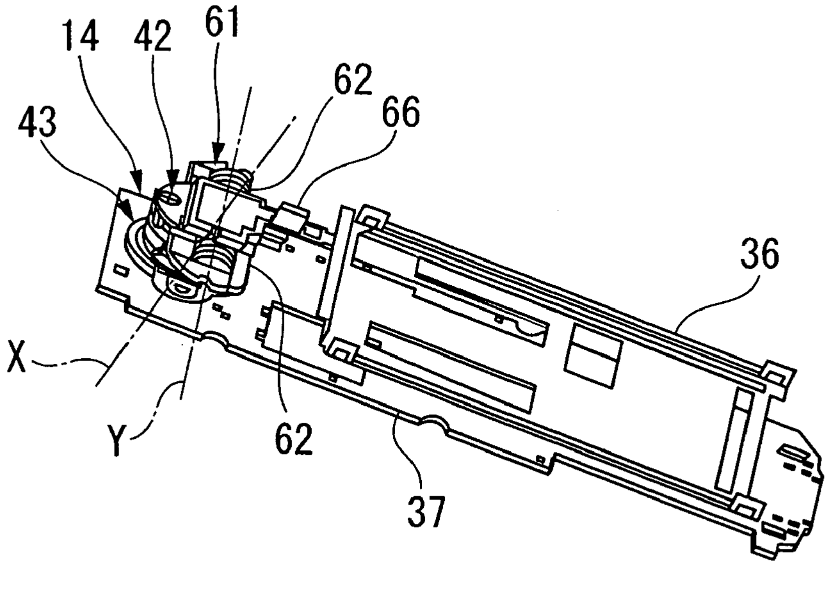
FIG. 4 is a perspective view of the internal parts showing the internal structure of the portable device.
Figure 5:
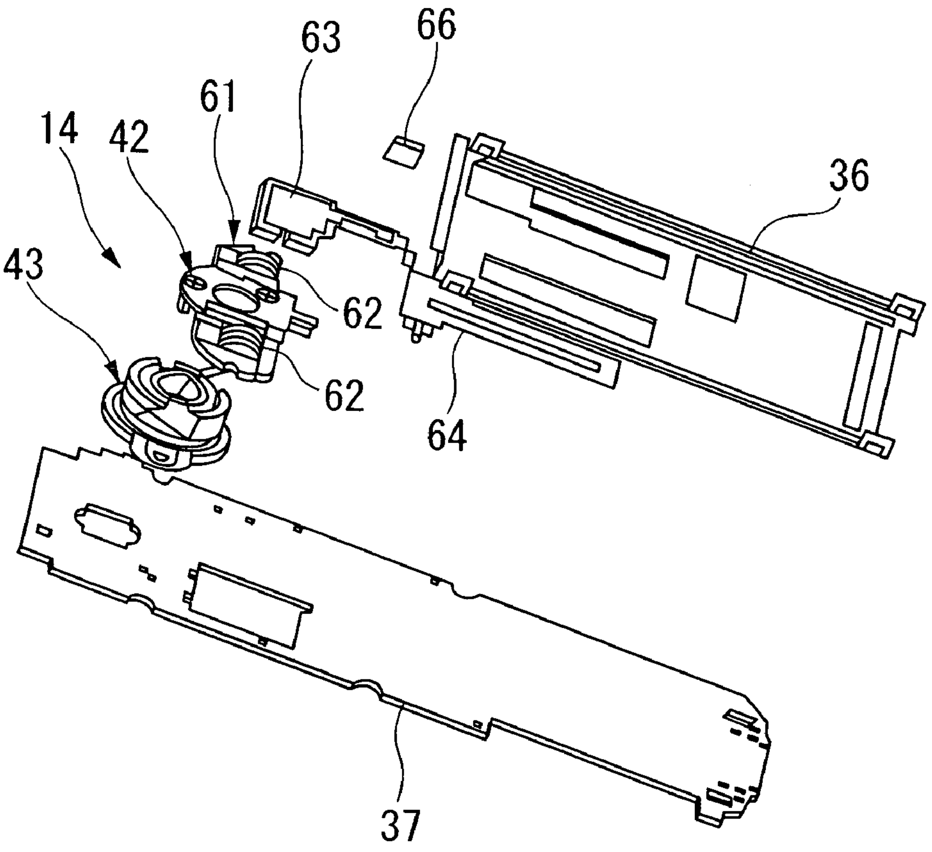
FIG. 5 is an exploded perspective view of the internal parts showing the internal structure of the portable device.

FIG. 1 is a perspective view showing a portable device. FIG. 2 is an exploded perspective view showing the state in which the display side front case of the portable device is removed. FIG. 3 is a perspective view of the display side front case seen from the rear side. FIG. 4 is a perspective view of the internal parts showing the internal structure of the portable device. FIG. 5 is an exploded perspective view of the internal parts showing the internal structure of the portable device.

As shown in the figures, portable device 11 includes a first casing 12 and a second casing 13. The first casing 12 and second casing 13 are coupled at a coupling part 14 near one of their ends so as to be rotatable with respect to each other around rotational axis X which is perpendicular to a plane of the second casing 13 that faces the first casing 12. The portable device 11 has a so-called rotating form having two configurations: a closed state in which the first casing 12 and second casing 13 are stacked, and an open state in which the first casing 12 and second casing 13 are extended by rotating them with respect to each other (the state shown by the dashed line in FIG. 1).

The first casing 12 includes a display device 15 constituted by a liquid crystal display or an organic EL display for displaying an operating menu or screen of a telephone, and a speaker 17, which are provided on the surface opposite the surface which faces the second casing 13. A side key 16 is provided on the side surface.

The second casing 13 includes a numeric keypad or cursor keys to be used in dial input or menu operation and a microphone (which are not shown), which are provided on the surface which faces the first casing 12. A side key 18 is provided on the side surface. Other elements (not shown) which constitute the mobile phone are housed therein, such as a battery, CPU, memory, and wireless part.

Figure 6:
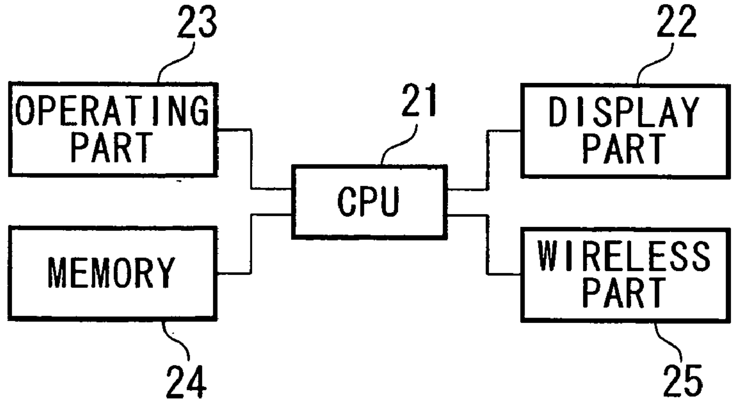
FIG. 6 is a block diagram which explains the functions of the portable device.

FIG. 6 is a block diagram which explains the functions of the portable device.

As shown in the figure, the portable device 11 includes a CPU 21. This CPU 21 is connected to a display part 22 constituted by a display device 15, an operating part 23 such as a numeric keypad, cursor keys, and side keys 16 and 18, a memory 24 such as a ROM or RAM, and a wireless part 25. The CPU 21 carries out communications by means of the display part 22, operating part 23, memory 24, and wireless part 25.

During standby, the portable device 11 is in a closed state such that the first casing 12 is disposed so as to be stacked the second casing 13. In this state, when using a function built into the portable device 11, it is possible to carry out the selected function by operating the side keys 16 and 18 provided on the side surfaces of each casing 12 and 13. Furthermore, when it is necessary to perform dial input, character input, and the like, in order to make a call, since it is not possible to perform input using the side keys 16 and 18, the first casing 12 is rotated 180 degrees at the coupling part 14 into the open state which exposes the numeric keypad and cursor keys (the state shown by the broken line in FIG. 1), and character input is carried out by operating the numeric keypad or cursor keys.

This portable device 11 provides each of the first casing 12 and second casing 13 with a split structure.

In other words, the first casing 12 has a structure in which a display side rear case 31 and a display side front case 32 are combined, and the second casing 13 has a structure in which an operating side rear case 33 and an operating side front case 34 are combined.

Next, the internal structures of the first casing 12 and second casing 13 will be explained.

The first casing 12 is provided with a holder 36 constituted by an electrically conductive material which supports the display device 15 that constitutes the display part 22. The second casing 13 is provided with a circuit board 37.

Between the first casing 12 and the second casing 13, the coupling part 14 is provided which rotatably couples the first casing 12 and the second casing 13.

This coupling part 14 is constituted by a rotating shaft 42 provided at the first casing 12 side and a bearing 43 provided at the second casing 13 side. The rotating shaft 42 and bearing 43 are formed from an electrically conductive metal material.

Figure 7:
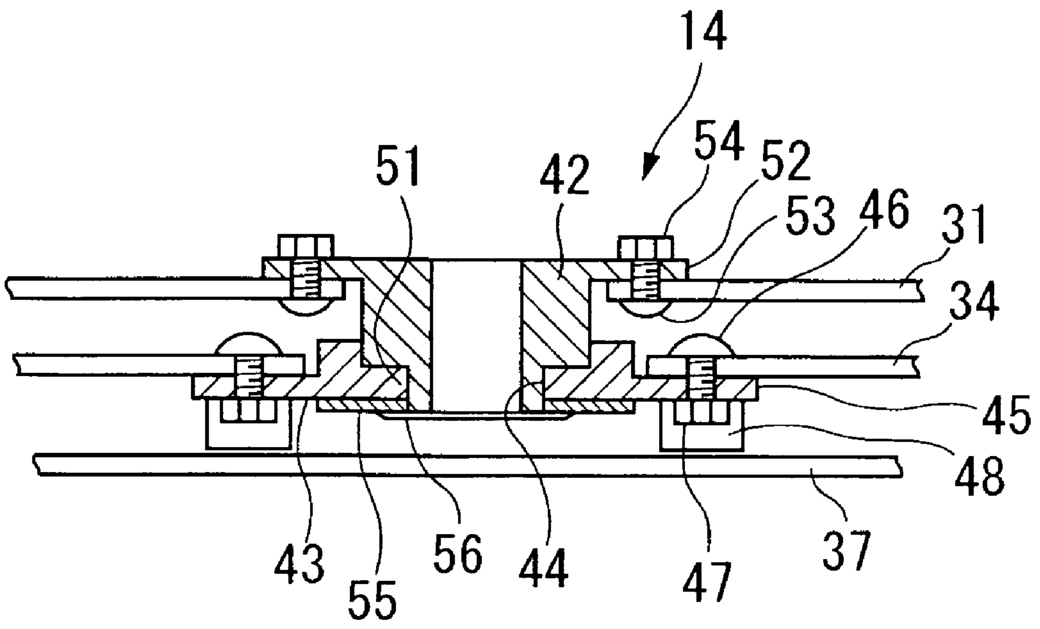
FIG. 7 is a cross-sectional diagram which explains the general structure of the coupling part.
Figure 8:
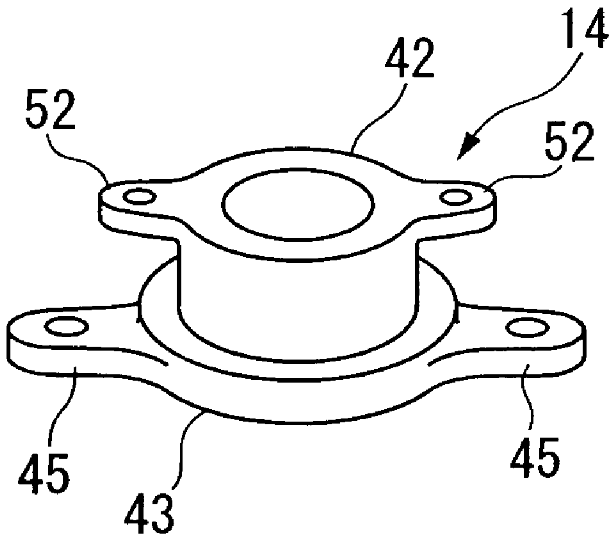
FIG. 8 is a perspective view which explains the general structure of the coupling part.

As shown in FIGS. 7 and 8, the bearing 43 has a slide hole 44 at the center thereof, and has a flange 45 at the outer periphery thereof. The flange 45 is fixed to the operating side front case 34 of the second casing 13 by a screw 46 and a nut 47. Furthermore, an electrical continuity plate spring 48 is fixed to the flange 45 of the bearing 43 in a state of electrical continuity. The electrical continuity plate spring 48 makes contact in electrical continuity with the ground pattern (conductive layer) of the circuit board 37.

The rotating shaft 42 has a slide pin 51 at the lower end thereof, and has a flange 52 at the outer periphery thereof. The flange 52 is fixed in a state of electrical continuity to the display side rear case 31 of the first casing 12 by a screw 53 and a nut 54.

The slide pin 51 of the lower end of the rotating shaft 42 is slidably inserted into the slide hole 44 of the bearing 43. By means of a seal part 56 which seals the end surface via a washer 55, the bearing 43 and rotating shaft 42 are coupled so as to be rotatable with respect to each other and in a state of electrical continuity.

The rotating shaft 42 is provided with a rocking mechanism 61. This rocking mechanism 61 allows the first casing 12 to rock by a prescribed angle around the axis Y which is perpendicular to the rotational axis X in the coupling part 14. Therefore, by means of winding springs 62 provided at both sides, the first casing 12 is energized toward the second casing 13 when in the closed state.

A cover plate 63 formed from a metal material is attached to the rotating shaft 42 in a state of electrical continuity. A bracket 64 is formed on this cover plate 63. The bracket 64 is provided in a state in which it is in electrical continuity with each of the holder 36 and the ground pattern on the circuit board (not shown) provided in the first casing 12.

A decorative member (conductive part) 19 having a metal plating is provided on a plastic material surface on the display side front case 32 of the first casing 12. A portion of this decorative member 19 is exposed at the outer surface of the display side front case 32. An electrically conductive member 66 is disposed in a sandwiched state between the decorative member 19 and the cover plate 63 of the coupling part 14. Since the outer periphery of a sponge or cloth of this electrically conductive member 66 is wrapped by an electrically conductive sheet such as aluminum foil, it has elasticity. Therefore, when attaching the display side front case 32 to the display side rear case 31, contact is made with the electrically conductive member 66 in a sandwiched state between the cover plate 63 which electrically conducts with the coupling part 14 and the decorative member 19, so that the decorative member 19 and the coupling part 14 electrically conduct.

In the portable device 11 having the above-mentioned structure, the decorative member 19, the ground pattern of the circuit board, and the holder 36 of the first casing 12 electrically conduct with the ground pattern of the circuit board 37 of the second casing 13 via the coupling part 14 which rotatably couples the first casing 12 and second casing 13.

In other words, according to this portable device 11, the decorative member 19, the ground pattern of the circuit board (not shown), and the holder 36 which are provided in the first casing 12, and the ground pattern of the circuit board 37 which is provided in the second casing 13 electrically conduct by means of the coupling part 14 which couples the first casing 12 and second casing 13 so as to be rotatable around the rotational axis X which is perpendicular to the plane of the first casing 12 and second casing 13. Therefore, it is possible to direct static electricity generated in each of the first casing 12 and second casing 13 to a ground conductor such as the ground pattern of the circuit board 37 provided in the second casing 13 via the coupling part 14, and it is possible to prevent the exertion of bad effects on the various control parts, electronic parts, and electric parts which are housed in the portable device 11.

By this means, it is not necessary to provide wires which connect the ground pattern of the circuit board provided in the first casing 12 to the ground pattern of the circuit board provided in the second casing 13. Therefore, it is possible to reduce the number of wires to be passed into the coupling part 14, and it is possible to provide a gap between the wires which pass through the coupling part 14. Therefore, it is possible to prevent twisting or torsion of the wires when the first casing 12 and second casing 13 move with respect to each other.

Furthermore, by sandwiching the electrically conductive member 66 having an elastic material by means of the decorative member 19 of the first casing 12 and the cover plate 63 which electrically conducts with the coupling part 14, the decorative member 19 and the coupling part 14 electrically conduct. Therefore, it is possible to make the first casing 12 electrically conduct with the coupling part 14 by means of the electrically conductive member 66 by simply attaching the display side front case 32 which constitutes the first casing 12. It is possible to eliminate the need for a special structure which makes the first casing 12 and coupling part 14 electrically conduct by connecting a ground wire or the like. It is also possible to further simplify the structure.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A portable device comprising:

a first casing which houses a circuit board having a first conductive layer;

a second casing which houses a circuit board having a second conductive layer; and a coupling part which rotatably couples the first casing and the second casing, wherein the coupling part has a bearing and a rotating shaft, and the bearing and the rotating shaft are made of a metal material, and the first conductive layer is electrically connected to the second conductive layer via the coupling part, wherein the first conductive layer and the second conductive layer are ground conductors.

2. The portable device according to claim 1 further comprising:

a conductive part which is present on at least one surface of the first or second casing; and an elastic conductive member which is elastically sandwiched between the conductive part and the coupling part, wherein the conductive part is electrically connected with the coupling part via the elastic conductive member.

3. A portable device comprising:

a first casing which houses a circuit board having a first conductive layer;

a second casing which houses a circuit board having a second conductive layer; and a coupling part which couples the first casing and the second casing so as to be rotatable with respect to each other around an axis in a direction in which the first casing and the second casing are stacked, wherein the coupling part has a bearing and a rotating shaft, and the bearing and the rotating shaft are made of a metal material, and the first conductive layer is electrically connected to the second conductive layer via the coupling part, wherein the first conductive layer and the second conductive layer are ground conductors.

4. The portable device according to claim 3 further comprising:

a conductive part which is present on at least one surface of the first or second casing; and an elastic conductive member which is elastically sandwiched between the conductive part and the coupling part, wherein the conductive part is electrically connected with the coupling part via the elastic conductive member.

5. The portable device according to claim 3, further comprising:

a display part;

a speaker;

operating keys; and a microphone, wherein the display part and the speaker are disposed at a surface of the first casing opposite to the surface of the first casing facing the second casing, and the operating keys and the microphone arc disposed at a surface of the second casing facing the first casing, when the first casing and the second casing are stacked.

6. The portable device according to claim 5, wherein the first casing has a holder made of a conductive material for holding the display part, the holder is electrically connected to the coupling part.

7. The portable device according to claim 5, further comprising:

a conductive part which is present on at least one surface of the first casing; and an elastic conductive member which is elastically sandwiched between the conductive part and the coupling part, wherein the conductive part is electrically connected with the coupling part via the elastic conductive member.

8. The portable device according to claim 7, wherein the first casing has a holder made of a conductive material for holding the display part, and the holder is electrically connected to the coupling part.

9. The portable device according to claim 8, wherein the holder, the coupling part, and the circuit board having the first conductive layer are electrically connected via a bracket.

* * * * *